(12) United States Patent
Mori

(10) Patent No.: US 11,454,550 B2
(45) Date of Patent: Sep. 27, 2022

(54) TEMPERATURE DETECTION DEVICE

(71) Applicant: FUJI ELECTRIC CO., LTD., Kawasaki (JP)

(72) Inventor: Takahiro Mori, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 731 days.

(21) Appl. No.: 16/282,871

(22) Filed: Feb. 22, 2019

(65) Prior Publication Data

US 2019/0310140 A1    Oct. 10, 2019

(30) Foreign Application Priority Data

Apr. 6, 2018    (JP) .............................. JP2018-073681

(51) Int. Cl.
*G01K 3/00* (2006.01)
*G01K 7/01* (2006.01)
*H03K 17/08* (2006.01)

(52) U.S. Cl.
CPC ............... *G01K 3/005* (2013.01); *G01K 7/01* (2013.01); *H03K 2017/0806* (2013.01)

(58) Field of Classification Search
USPC ................................................... 374/178, 1
See application file for complete search history.

(56) References Cited

U.S. PATENT DOCUMENTS

2003/0086476 A1\*   5/2003   Mizuta ................... G01K 15/00
                                                        374/178
2016/0187203 A1   6/2016   Sugiura et al.

FOREIGN PATENT DOCUMENTS

| JP | H7-135731 A | 5/1995 |
|---|---|---|
| JP | 2003121267 A | 4/2003 |
| JP | 2007-312529 A | 11/2007 |
| JP | 2011052980 A | 3/2011 |
| JP | 2014228500 A | 12/2014 |
| JP | 2016121902 A | 7/2016 |
| JP | 2016-163512 A | 9/2016 |

OTHER PUBLICATIONS

Translation of JP2014228500A (Year: 2014).\*
Japanese Patent Office Action dated Jan. 25, 2022 for corresponding JP Patent Application No. 2018-073681.

\* cited by examiner

*Primary Examiner* — Mirellys Jagan
(74) *Attorney, Agent, or Firm* — Rabin & Berdo, P.C.

(57) ABSTRACT

A temperature detection device includes a temperature detection diode, a comparator, and a forward current correction circuit. The comparator compares a forward voltage of the temperature detection diode with a threshold voltage and outputs a level signal corresponding to a temperature state. The forward current correction circuit includes a current mirror circuit including a first transistor and a second transistor, a third transistor, an operational amplifier and a variable resistor, and corrects a forward current of the temperature detection diode to change the forward voltage.

3 Claims, 5 Drawing Sheets

TEMPERATURE DETECTION DEVICE

CROSS-REFERENCE TO RELATED APPLICATION

This application is based upon and claims the benefit of priority of the prior Japanese Patent Application No. 2018-073681, filed on Apr. 6, 2018, the entire contents of which are incorporated herein by reference.

BACKGROUND OF THE INVENTION

1. Field of the Invention

The embodiments discussed herein are related to a temperature detection device.

2. Background of the Related Art

In recent years the development of semiconductor modules in which an insulated gate bipolar transistor (IGBT) and a drive circuit for driving the IGBT are incorporated has progressed. An intelligent power module (IPM) and the like are known as such semiconductor modules and are widely used in alternating current (AC) servomotors, air conditioners, and the like.

Furthermore, each semiconductor module has an overheat protection function for avoiding an overheated state and protecting an element. For example, the overheat protection function is as follows. A temperature detection element is mounted near an IGBT, the temperature is monitored by the temperature detection element, and the overheat of an IGBT chip is detected.

In addition, a current mainly flows through a freewheel diode (FWD) connected to an IGBT and the temperature of the IGBT does not appreciably rise, depending on the applications of semiconductor modules. With these semiconductor modules, the temperature of a case is detected.

FIG. 4 illustrates an example of the structure of a conventional temperature detection circuit. A temperature detection circuit 1 includes a current source 11, a temperature detection diode Dt, a comparator 12, an alarm detection circuit 13, and a threshold voltage correction circuit 14.

Furthermore, a monitor pad pd is connected to the temperature detection circuit 1. The monitor pad pd is a pad used for monitoring a forward voltage VF of the temperature detection diode Dt, a forward current IF flowing through the temperature detection diode Dt, and the like at temperature detection test time (not used at operation time).

Each circuit element is connected in the following way. One end of the current source 11 is connected to a power source voltage Vcc. The other end of the current source 11 is connected to an anode of the temperature detection diode Dt, a positive input terminal (+) of the comparator 12, and the monitor pad pd. A cathode of the temperature detection diode Dt is connected to a negative voltage terminal of the threshold voltage correction circuit 14 and a reference potential (hereinafter denoted by GND).

A negative input terminal (−) of the comparator 12 is connected to a positive voltage terminal of the threshold voltage correction circuit 14. An output terminal of the comparator 12 is connected to an input terminal of the alarm detection circuit 13.

The forward voltage VF of the temperature detection diode Dt falls with a rise in case temperature. In addition, the threshold voltage correction circuit 14 outputs a threshold voltage VOH of the comparator 12 used for determining whether or not case temperature corresponds to an overheated state.

For example, the threshold voltage correction circuit 14 sets the threshold voltage VOH so that VOH<VF in a normal temperature state and so that VF≤VOH in an overheated state. If VOH<VF, that is to say, case temperature corresponds to a normal temperature state, then a high potential level (H-level) signal is outputted from the comparator 12. If VF≤VOH, that is to say, case temperature corresponds to an overheated state, then a low potential level (L-level) signal is outputted from the comparator 12.

When the alarm detection circuit 13 receives an L-level signal outputted from the comparator 12, the alarm detection circuit 13 recognizes that case temperature corresponds to an overheated state, and outputs, for example, an alarm signal for a determined period of time. The threshold voltage VOH generated by the threshold voltage correction circuit 14 is capable of being corrected (adjusted) and was formerly corrected by a Zener zap method.

On the other hand, a threshold of case temperature (threshold temperature TcOH) in a wafer test which is the object of overheat protection is calculated from the following expression (1). Case temperature higher than or equal to the threshold temperature TcOH corresponds to an overheated state. Case temperature lower than the threshold temperature TcOH corresponds to a non-overheated state.

$$\text{TcOH} = ((VF - VOH)/(\text{temperature coefficient of } VF)) + Ta \tag{1}$$

In expression (1), VF is a forward voltage (mV) of the temperature detection diode Dt at the normal temperature, VOH is a threshold voltage (mV) of the comparator 12, temperature coefficient of VF is the temperature change amount (mV/° C.) of VF in the range of 25 to 125° C., and Ta is an environmental temperature (° C.) in a wafer test.

Formerly the following technique was proposed (see, for example, Japanese Laid-open Patent Publication No. 2007-312529). A constant-voltage power supply circuit, a temperature detection diode, a constant-current source, and an inverter are disposed between first and second voltage power supplies. A gate-source voltage of a transistor included in the inverter is made a voltage across the constant-current source to increase temperature detection sensitivity.

If the structure of the temperature detection circuit 1 illustrated in FIG. 4 is adopted, then only the threshold voltage VOH is corrected. An error occurs in case temperature detection due to the influence of variation in the forward voltage VF of the temperature detection diode Dt.

FIG. 5 is a view for describing a state in which an error occurs in case temperature detection. A graph g1 indicates the relationship between the forward voltage VF and case temperature T (VF-T characteristic). In FIG. 5, a vertical axis indicates the forward voltage VF and a horizontal axis indicates case temperature T (° C.).

A waveform w1 indicates the representative value (Typ) of the forward voltage VF of the temperature detection diode Dt. As stated above, the forward voltage VF falls with a rise in temperature. Waveforms w2 and w3 indicate variations in the forward voltage VF. Manufacturing variation of the temperature detection diode Dt creates variation in the forward voltage VF. As a result, the forward voltage VF varies upward or downward with respect to the waveform w1.

Formerly the threshold voltage VOH was corrected with the line (waveform w1) of the representative value (Typ) of the forward voltage VF as a premise. By doing so, case temperature corresponding to an overheated state was detected. However, the VF-T characteristic indicated by the waveform w2 or w3 deviates from the representative value. In that case, a case temperature of TcL or TcH is detected. These case temperatures deviate from a case temperature of Tc which is an ideal case temperature after setting the threshold voltage VOH. As a result, an error occurs in case temperature detection.

As has been described, formerly an error occurred in case temperature detection. Accordingly, the standard for case temperature includes the error. This widens the width of the standard, resulting in deterioration in temperature detection accuracy.

SUMMARY OF THE INVENTION

According to an aspect, there is provided a temperature detection device including a temperature detection diode, a comparator which compares a forward voltage of the temperature detection diode with a threshold voltage and which outputs a level signal corresponding to a temperature state, and a forward current correction circuit which includes a current mirror circuit including a first transistor and a second transistor, a third transistor, an operational amplifier, and a variable resistor and which corrects a forward current of the temperature detection diode to change the forward voltage, a first terminal of the first transistor being connected to a power supply voltage and a first terminal of the second transistor, a second terminal of the first transistor being connected to a third terminal of the first transistor, a second terminal of the second transistor, and a third terminal of the third transistor, a third terminal of the second transistor being connected to a positive input terminal of the comparator and an anode of the temperature detection diode, the threshold voltage being inputted to a negative input terminal of the comparator, a reference voltage being inputted to a positive input terminal of the operational amplifier, an output terminal of the operational amplifier being connected to a second terminal of the third transistor, a negative input terminal of the operational amplifier being connected to a first terminal of the third transistor and one end of the variable resistor, another end of the variable resistor being connected to a cathode of the temperature detection diode and a reference potential.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described with reference to the accompanying drawings. Components in the specification and the drawings which have substantially the same functions are marked with the same numerals. By doing so, repeated descriptions may be omitted.

First Embodiment

Figure 1:
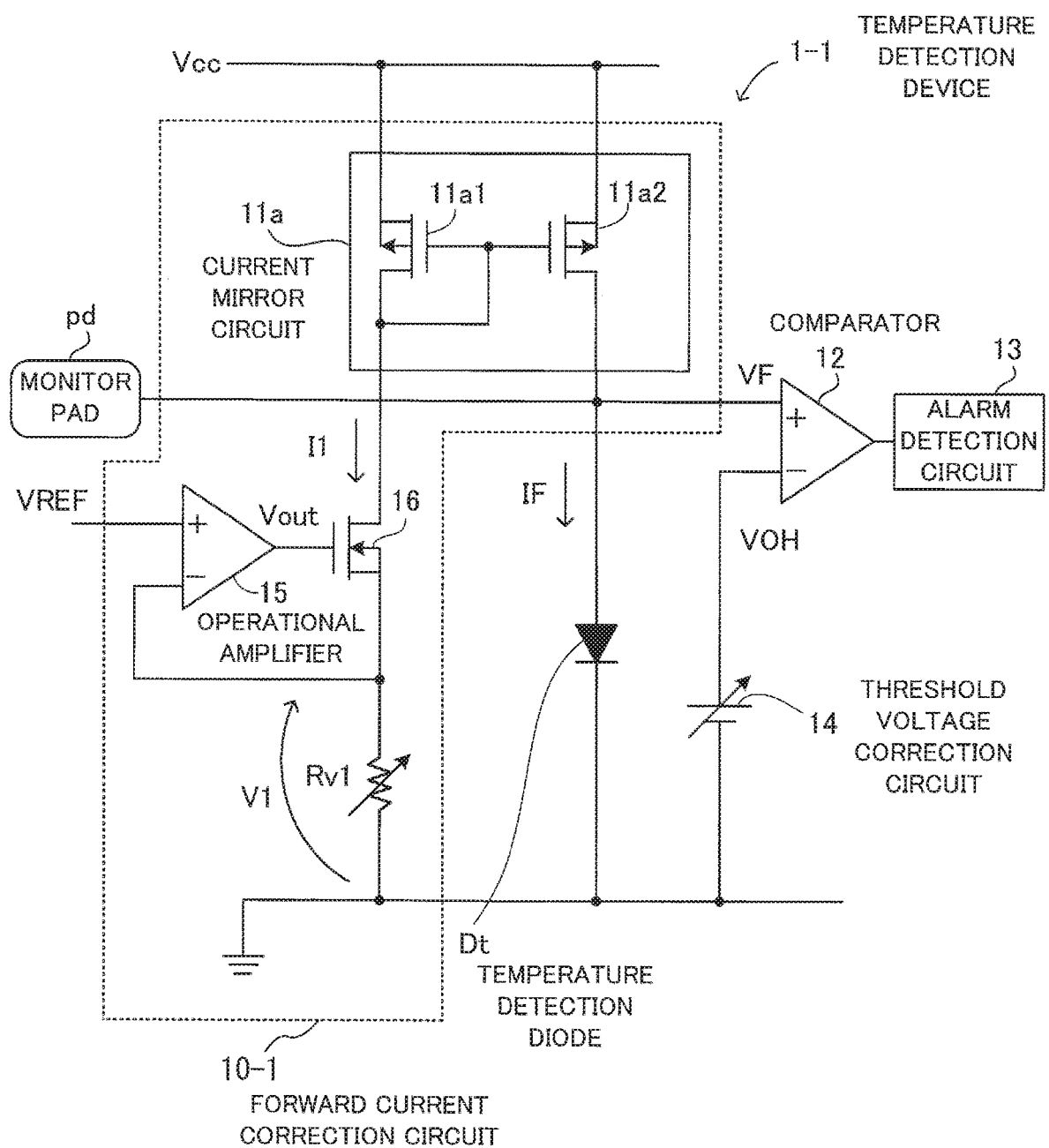
FIG. 1 illustrates an example of the structure of a temperature detection device (first embodiment)

FIG. 1 illustrates an example of the structure of a temperature detection device. A temperature detection device 1-1 according to a first embodiment includes a temperature detection diode Dt which is a temperature detection element, a comparator 12, an alarm detection circuit 13, a threshold voltage correction circuit 14, and a forward current correction circuit 10-1. Furthermore, the forward current correction circuit 10-1 includes a current mirror circuit 11a, an operational amplifier 15, a transistor 16, and a variable resistor Rv1.

The current mirror circuit 11a includes a transistor 11a1 (first transistor) and a transistor 11a2 (second transistor). In the example of FIG. 1, p-channel metal oxide semiconductor field effect transistors (MOSFETs) are used as the transistors 11a1 and 11a2 (hereinafter referred to as the pMOS transistors 11a1 and 11a2 respectively).

In addition, in the example of FIG. 1, an re-channel MOSFET is used as the transistor 16 (third transistor) (hereinafter referred to as the nMOS transistor 16). With the pMOS transistors 11a1 and 11a2 and the nMOS transistor 16, a first terminal, a second terminal, and a third terminal correspond to a source, a gate, and a drain respectively.

Each circuit element is connected in the following way. A source of the pMOS transistor 11a1 is connected to a power supply voltage Vcc and a source of the pMOS transistor 11a2. A gate of the pMOS transistor 11a1 is connected to a drain of the pMOS transistor 11a1, a gate of the pMOS transistor 11a2, and a drain of the nMOS transistor 16.

A drain of the pMOS transistor 11a2 is connected to a monitor pad pd, a positive input terminal (+) of the comparator 12, and an anode of the temperature detection diode Dt.

A reference voltage VREF is inputted to a positive input terminal (+) of the operational amplifier 15. An output terminal of the operational amplifier 15 is connected to a gate of the nMOS transistor 16. A negative input terminal (−) of the operational amplifier 15 is connected to a source of the nMOS transistor 16 and one end of the variable resistor Rv1.

The other end of the variable resistor Rv1 is connected to a cathode of the temperature detection diode Dt, a negative voltage terminal of the threshold voltage correction circuit 14, and GND. A positive input terminal of the threshold voltage correction circuit 14 is connected to a negative input terminal (−) of the comparator 12. An output terminal of the comparator 12 is connected to an input terminal of the alarm detection circuit 13.

A forward current IF of the temperature detection diode Dt is corrected by the forward current correction circuit 10-1. In this case, a current I1 flowing through the drain of the nMOS transistor 16 changes by the function of the operational amplifier 15 so that a voltage V1 which is a potential on the source side of the nMOS transistor 16 will become equal to the reference voltage VREF (V1=VREF). As a result, the forward current IF is corrected. In addition, for example, the reference voltage VREF is generated by the use of a MOS (such as a regulator) on a main chip in a package in which the temperature detection device 1-1 is incorporated.

The flow of the operation of correcting the forward current IF will be described. First, if the resistance value of the variable resistor Rv1 is decreased, then the voltage V1 drops. When the voltage V1 drops, the potential difference between the voltage V1 and the reference voltage VREF increases. As a result, an output voltage Vout of the operational amplifier 15 increases in order to increase the voltage V1.

When the output voltage Vout of the operational amplifier 15 increases, the current I1 flowing through the nMOS transistor 16 increases. When the current I1 increases, the forward current IF increased according to the mirror ratio of the current mirror circuit 11a flows to the temperature detection diode Dt. If the resistance value of the variable resistor Rv1 is decreased, then the forward current IF is corrected in this way so as to increase.

On the other hand, if the resistance value of the variable resistor Rv1 is increased, then the voltage V1 rises. When the voltage V1 rises, the potential difference between the voltage V1 and the reference voltage VREF decreases. As a result, the output voltage Vout of the operational amplifier 15 decreases in order to decrease the voltage V1.

When the output voltage Vout of the operational amplifier 15 decreases, the current I1 flowing through the nMOS transistor 16 decreases. When the current I1 decreases, the forward current IF decreased according to the mirror ratio of the current mirror circuit 11a flows to the temperature detection diode Dt. If the resistance value of the variable resistor Rv1 is increased, then the forward current IF is corrected in this way so as to decrease.

Detection of a forward voltage VF, correction of a threshold voltage VOH, and control of the resistance value of the variable resistor Rv1 may be performed by an upper processor (not illustrated). In this case, a plurality of set values are held as the threshold voltage VOH and the resistance value of the variable resistor Rv1 in a memory such as an erasable programmable read only memory (EPROM). When the upper processor detects the forward voltage VF, the upper processor sets a desired value held in the memory in the threshold voltage correction circuit 14 or the variable resistor Rv1.

Figure 2:
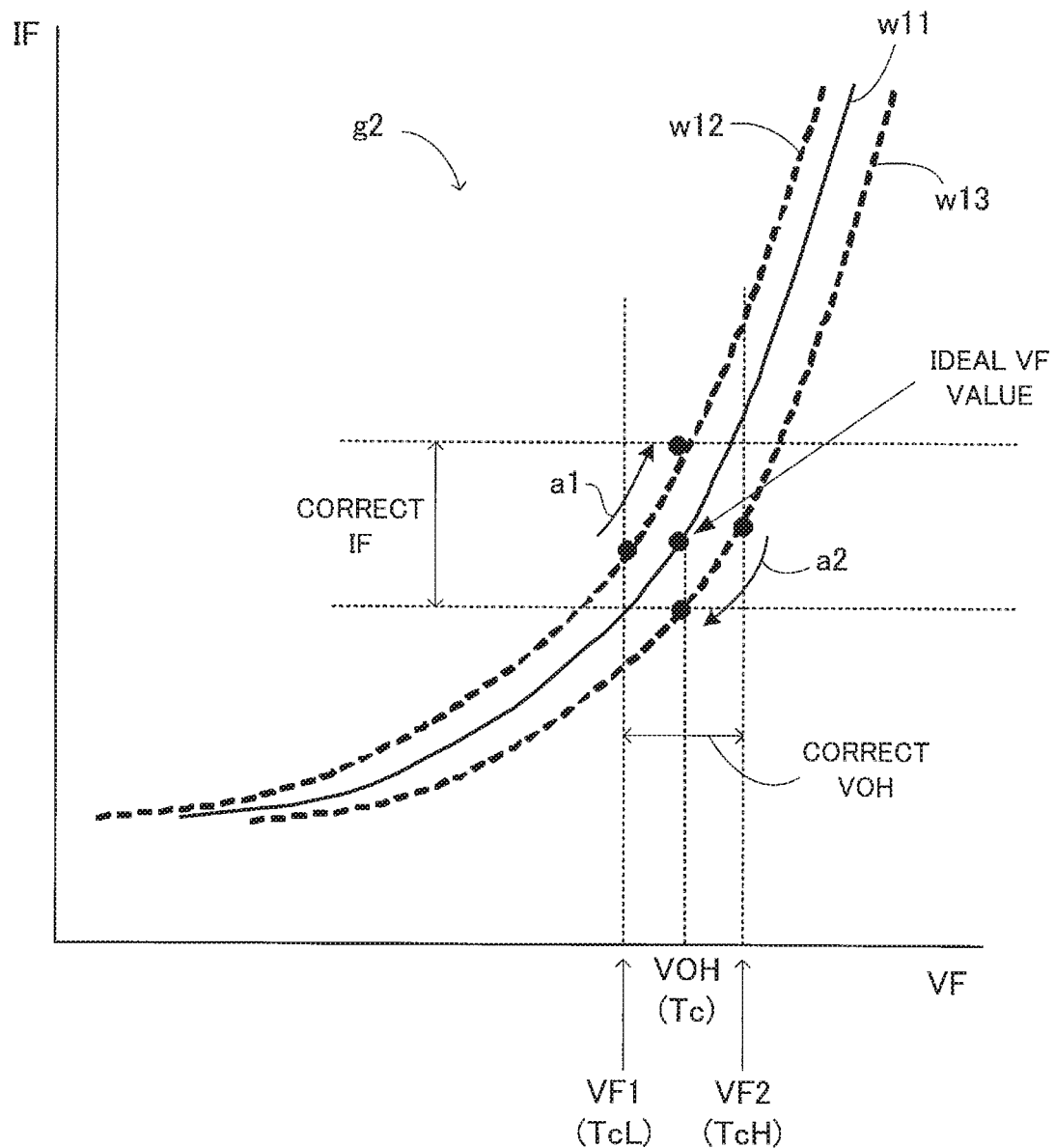
FIG. 2 is a view for describing correction operation performed by the temperature detection device.

FIG. 2 is a view for describing correction operation performed by the temperature detection device. A graph g2 indicates the relationship between the forward current IF and the forward voltage VF. In FIG. 2, a vertical axis indicates the forward current IF and a horizontal axis indicates the forward voltage VF.

A waveform w11 indicates the forward current IF obtained at the time of the forward voltage VF of the temperature detection diode Dt being a representative value (Typ). Furthermore, as stated above, there is variation in the forward voltage VF. As a result, the forward current IF varies leftward or rightward with respect to the waveform w11 according to the variation in the forward voltage VF.

A waveform w12 indicates the forward current IF obtained at the time of the forward voltage VF varying in the direction in which it decreases from the representative value. A waveform w13 indicates the forward current IF obtained at the time of the forward voltage VF varying in the direction in which it increases from the representative value.

On the other hand, the threshold voltage VOH is set by the above threshold voltage correction. It is assumed that the threshold voltage VOH is an ideal forward voltage VF (hereinafter referred to as the ideal VF value) used as reference for determining whether or not case temperature corresponds to an overheated state.

Figure 4:
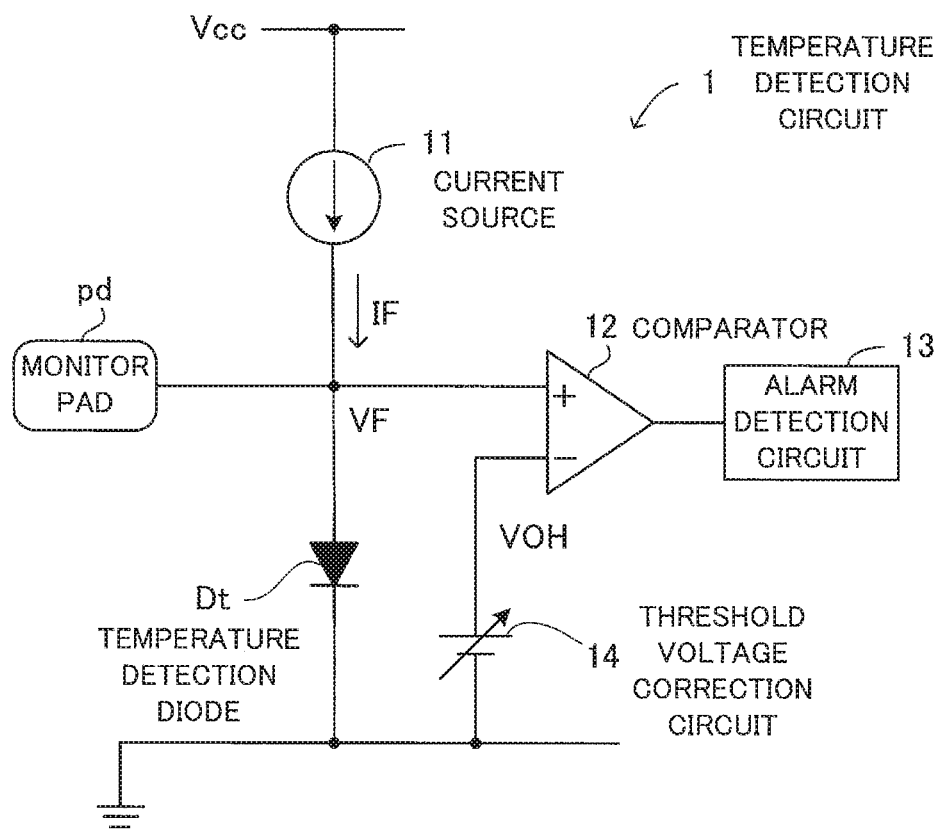
FIG. 4 illustrates an example of the structure of a conventional temperature detection circuit.
Figure 5:
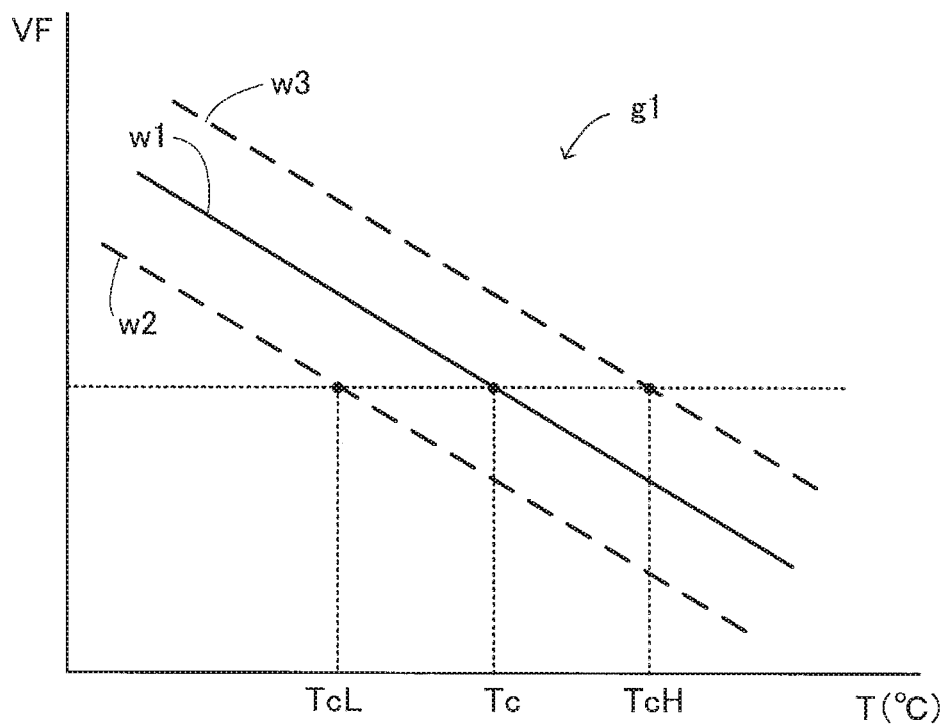
FIG. 5 is a view for describing a state in which an error occurs in case temperature detection.

The ideal VF value is equal to the threshold voltage VOH. The ideal VF value is a VF value at the time of detecting case temperature, that is to say, at the time of case temperature being high. Furthermore, a wafer test is performed at the normal temperature. Therefore, a VF-T characteristic like that illustrated in FIG. 4 is obtained in advance and a VF value at the time of case temperature being high is estimated at the normal temperature.

If the waveform w12 is obtained in the graph g2, then a VF value (forward voltage VF1) corresponding to the forward voltage VF is smaller than the ideal VF value. Therefore, the forward current IF is corrected to change the forward voltage VF. That is to say, the forward current IF is corrected so as to increase (arrow a1). By doing so, the forward voltage VF1 becomes the ideal VF value.

In this case, control is exercised so that the resistance value of the variable resistor Rv1 will decrease. By exercising such control, a case temperature TcL at the time of the forward voltage VF1 being obtained approaches an ideal case temperature Tc at the time of the threshold voltage VOH being set.

In addition, if the waveform w13 is obtained, then a VF value (forward voltage VF2) corresponding to the forward voltage VF is greater than the ideal VF value. Therefore, the forward current IF is corrected to change the forward voltage VF. That is to say, the forward current IF is corrected so as to decrease (arrow a2). By doing so, the forward voltage VF2 becomes the ideal VF value.

In this case, control is exercised so that the resistance value of the variable resistor Rv1 will increase. By exercising such control, a case temperature TcH at the time of the forward voltage VF2 being obtained approaches the ideal case temperature Tc at the time of the threshold voltage VOH being set.

As stated above, if only the threshold voltage VOH is corrected, an error occurs in case temperature detection due to the influence of variation in the forward voltage VF. In order to eliminate this error, a circuit structure in which the forward current IF is variably controlled is adopted in this embodiment.

That is to say, not only the threshold voltage VOH but also the forward current IF is corrected in this embodiment. When the forward current IF is corrected, the forward current IF is increased on the basis of the forward voltage VF detected to increase the forward voltage VF. Alternatively, the forward current IF is decreased on the basis of the forward voltage VF detected to decrease the forward voltage VF. This reduces an error in case temperature detection and improves temperature detection accuracy.

Formerly the threshold voltage VOH was corrected by a Zener zap. As a result, one pad is needed for correcting one bit. In this embodiment, however, the threshold voltage VOH is corrected by the use of a set value held in advance in an EPROM.

Accordingly, even if the number of bits is increased, the number of pads does not change. Furthermore, because the mounting area of an EPROM is smaller than that of a Zener zap, the effect of suppressing an increase in mounting area is obtained.

Second Embodiment

Figure 3:
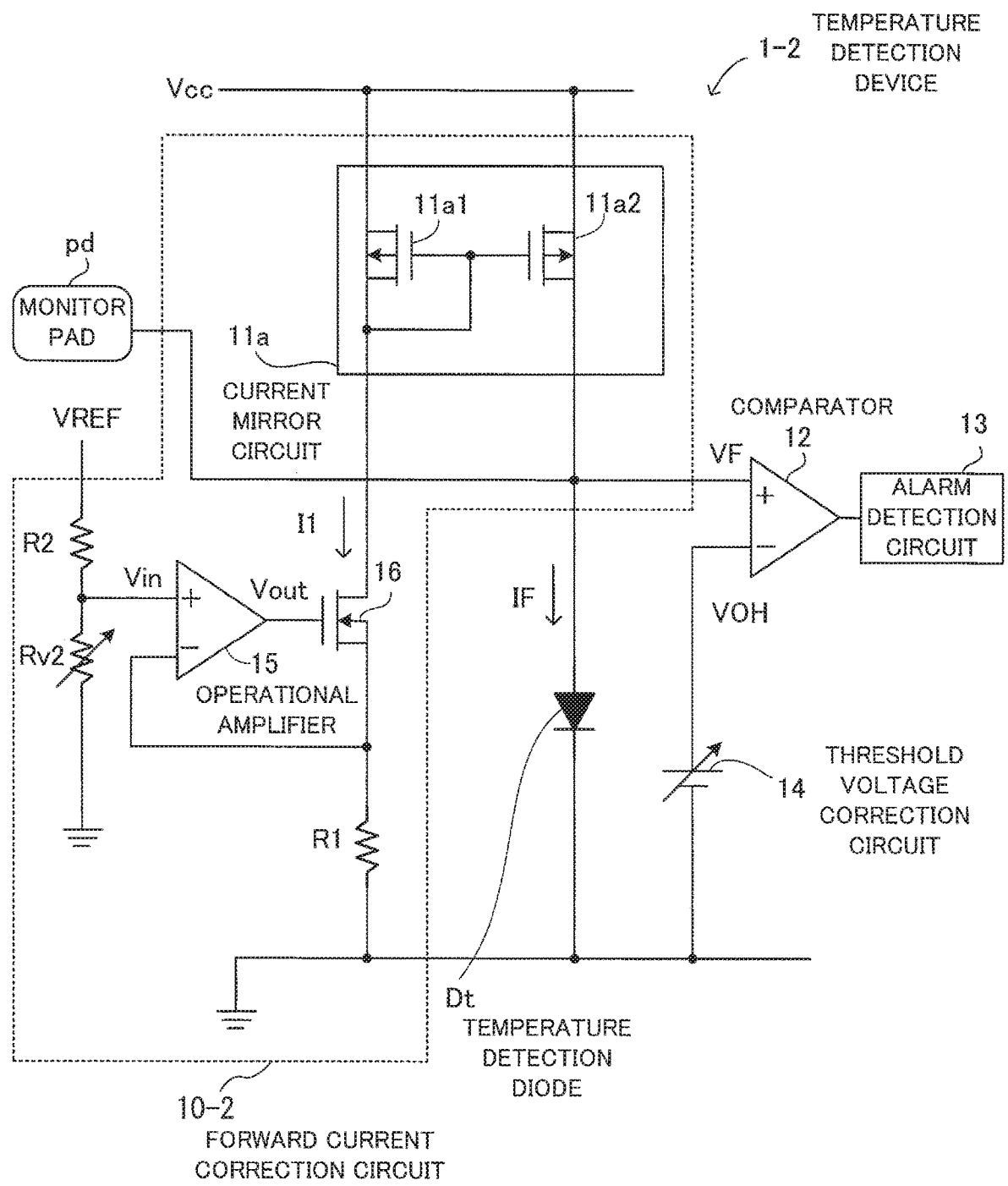
FIG. 3 illustrates an example of the structure of a temperature detection device (second embodiment)

FIG. 3 illustrates an example of the structure of a temperature detection device. A temperature detection device 1-2 according to a second embodiment includes a temperature detection diode Dt, a comparator 12, an alarm detection circuit 13, a threshold voltage correction circuit 14, and a forward current correction circuit 10-2.

In addition, the forward current correction circuit 10-2 includes a current mirror circuit 11a, an operational amplifier 15, a transistor 16, a resistor R1 (first resistance element), a resistor R2 (second resistance element), and a variable resistor Rv2.

Each circuit element is connected in the following way. A source of a pMOS transistor 11a1 is connected to a power supply voltage Vcc and a source of a pMOS transistor 11a2. A gate of the pMOS transistor 11a1 is connected to a drain of the pMOS transistor 11a1, a gate of the pMOS transistor 11a2, and a drain of the nMOS transistor 16.

A drain of the pMOS transistor 11a2 is connected to a monitor pad pd, a positive input terminal (+) of the comparator 12, and an anode of the temperature detection diode Dt.

A reference voltage VREF is inputted to one end of the resistor R2. The other end of the resistor R2 is connected to one end of the variable resistor Rv2 and a positive input terminal (+) of the operational amplifier 15. The other end of the variable resistor Rv2 is connected to GND.

An output terminal of the operational amplifier 15 is connected to a gate of the nMOS transistor 16. A negative input terminal (−) of the operational amplifier 15 is connected to a source of the nMOS transistor 16 and one end of the resistor R1.

The other end of the resistor R1 is connected to a cathode of the temperature detection diode Dt, a negative voltage terminal of the threshold voltage correction circuit 14, and GND. A positive input terminal of the threshold voltage correction circuit 14 is connected to a negative input terminal (−) of the comparator 12. An output terminal of the comparator 12 is connected to an input terminal of the alarm detection circuit 13.

A forward current IF of the temperature detection diode Dt is corrected by the forward current correction circuit 10-2. In this case, a current I1 flowing through the drain of the nMOS transistor 16 changes on the basis of a voltage Vin obtained by dividing the reference voltage VREF by the resistor R2 and the variable resistor Rv2. As a result, a forward current IF is corrected.

The flow of the operation of correcting the forward current IF will be described. The input voltage Vin of the operational amplifier 15 is given by $$Vin=VREF \times (Rv2/(R2+Rv2))$$

First, if the resistance value of the variable resistor Rv2 is increased, then the input voltage Vin of the operational amplifier 15 increases.

When the input voltage Vin of the operational amplifier 15 increases, an output voltage Vout of the operational amplifier 15 increases and the current I1 flowing through the nMOS transistor 16 increases. When the current I1 increases, the forward current IF increased according to the mirror ratio of the current mirror circuit 11a flows to the temperature detection diode Dt. If the resistance value of the variable resistor Rv2 is increased, then the forward current IF is corrected in this way so as to increase.

On the other hand, if the resistance value of the variable resistor Rv2 is decreased, then the input voltage Vin of the operational amplifier 15 drops. When the input voltage Vin of the operational amplifier 15 drops, the output voltage Vout of the operational amplifier 15 drops and the current I1 flowing through the nMOS transistor 16 decreases.

When the current I1 decreases, the forward current IF decreased according to the mirror ratio of the current mirror circuit 11a flows to the temperature detection diode Dt. If the resistance value of the variable resistor Rv2 is decreased, then the forward current IF is corrected in this way so as to decrease.

Detection of a forward voltage VF, correction of a threshold voltage VOH, and control of the resistance value of the variable resistor Rv2 may be performed by an upper processor. This is the same with the first embodiment. In addition, when the upper processor detects the forward voltage VF, the upper processor sets a desired value held in a memory in the threshold voltage correction circuit 14 or the variable resistor Rv2.

As has been described, not only the threshold voltage VOH but also the forward current IF is corrected in the second embodiment. This is the same with the first embodiment. When the forward current IF is corrected, the forward current IF is increased on the basis of the forward voltage VF detected to increase the forward voltage VF. Alternatively, the forward current IF is decreased on the basis of the forward voltage VF detected to decrease the forward voltage VF. This reduces an error in case temperature detection and improves temperature detection accuracy.

The embodiments have been described. Each component described in the embodiments may be replaced with another component having the same function. In addition, any other component or process may be added.

According to an aspect, temperature detection accuracy is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A temperature detection device comprising:
a temperature detection diode having an anode and a cathode;
a comparator having a positive input terminal and a negative input terminal, the comparator being configured to compare a forward voltage of the temperature detection diode, received at the positive input terminal thereof, with a threshold voltage received at the negative input terminal thereof, to thereby output a level signal corresponding to a temperature state; and
a forward current correction circuit configured to correct a forward current of the temperature detection diode to change the forward voltage, the forward current correction circuit including
a current mirror circuit including a first transistor and a second transistor,
a third transistor,
an operational amplifier having a positive input terminal, a negative input terminal and an output terminal, and
a variable resistor having a first end and a second end, a resistance value of the variable resistor being programmably controllable, wherein
each of the first, second and third transistors has a first terminal, a second terminal and a third terminal,
the first terminal of the first transistor is connected to a power supply voltage and the first terminal of the second transistor,
the second terminal of the first transistor is connected to the third terminal of the first transistor, the second terminal of the second transistor and the third terminal of the third transistor, the third terminal of the second transistor is connected to the positive input terminal of the comparator and the anode of the temperature detection diode, the positive input terminal of the operational amplifier is connected to a reference voltage, the output terminal of the operational amplifier is connected to the second terminal of the third transistor, and the negative input terminal of the operational amplifier is connected to the first terminal of the third transistor and the first end of the variable resistor; and the second end of the variable resistor is connected to the cathode of the temperature detection diode and a reference potential.

2. The temperature detection device according to claim 1, further comprising a processor that is configured to decrease the resistance value of the variable resistor to increase the forward current and increase the forward voltage, and increase the resistance value of the variable resistor to decrease the forward current and decrease the forward voltage.

3. A temperature detection device comprising:

a temperature detection element;

a comparator configured to compare a forward voltage of the temperature detection element with a threshold voltage, to thereby output a level signal corresponding to a temperature state; and a forward current correction circuit configured to correct a forward current of the temperature detection element to change the forward voltage, the forward current correction circuit including a variable resistor having a resistance value that is programmably controllable, and an operational amplifier having a positive input terminal, and a negative input terminal, the positive input terminal of the operational amplifier being connected to a reference voltage, and the negative input terminal of the operational amplifier being connected to the variable resistor.

* * * * *